United States Patent

Caspers et al.

Patent Number: 5,978,661
Date of Patent: Nov. 2, 1999

[54] TRANSMITTER CIRCUIT AND METHOD OF OPERATION

[75] Inventors: Alfred Caspers, Limburg; Norbert Roettger, Waldmuehlen, both of Germany

[73] Assignee: Motorola, Inc., Schaumburg, Ill.

[21] Appl. No.: 08/859,981

[22] Filed: May 21, 1997

[30] Foreign Application Priority Data

May 23, 1996 [GB] United Kingdom ............... 9610844

[51] Int. Cl.⁶ .................................................. H04B 1/04
[52] U.S. Cl. ............................................ 455/110; 455/126
[58] Field of Search .................... 455/73, 75, 84, 455/91, 110, 113, 115–116, 119, 126, 24, 232.1, 234.1–234.2, 236.1, 245.1, 249.1, 255–257, 263

[56] References Cited

U.S. PATENT DOCUMENTS 4,387,351  6/1983  Furiga et al. ........................ 455/119
5,507,015  4/1996  Karczewski et al. ................. 455/116

Primary Examiner—Reinhard J. Eisenzopf
Assistant Examiner—Marsha D. Banks-Harold
Attorney, Agent, or Firm—M. Mansour Ghomeshi

[57] ABSTRACT

A transmitter circuit including an oscillator circuit (30) having at least one input for receiving at least one modulation signal and an output (32) for providing a modulated signal. A modulation circuit (13) is operably coupled to the at least one input of the oscillator circuit (30) for providing the at least one modulation signal and a feedback path (34) between the oscillator circuit (30) and the modulation circuit (13) provides a representation of the modulated signal output from the oscillator circuit (30) to the modulation circuit (13). In response to the modulated signal, the modulation circuit (13) automatically adjusts an amplitude level of the modulation signal.

10 Claims, 2 Drawing Sheets

TRANSMITTER CIRCUIT AND METHOD OF OPERATION

FIELD OF THE INVENTION

This invention relates to transmitter circuits. The invention is applicable to, but not limited to, the generation of frequency modulated signals of transmitter circuits for radio communication units and method of generating said signals.

BACKGROUND OF THE INVENTION

The signal generation circuitry for mobile radios is a complex process with component cost and component count issues being high priorities for consideration in the radio design. A typical circuit for generating radio frequencies in a mobile radio, and in particular for generating frequency modulated radio frequencies, involves the use of a voltage controlled oscillator circuit (VCO). In generating a modulated transmit radio frequency, the VCO uses a voltage supply to control the frequency of operation and a is supplied (modulated) with the information e.g. voice and/or data, to be transmitted. In designing such VCO circuits, there is a design trade-off between VCO settling time—the time it takes for a particular frequency to be generated and remain within a specific frequency tolerance—and the frequency bandwidth of the audio signal input to the VCO circuit.

In order to resolve this trade-off dilemma, a typical approach is to use an additional low-frequency reference modulation input to the VCO circuit. The low-frequency reference modulation input is applied during a radio tune-up process to compensate for any low-frequency attenuation of the information signal. Thus, the settling time of the VCO circuit can be optimized by the radio designer at the expense of any low-frequency performance of the VCO as any poor attenuation performance can be compensated for. A typical approach to align the attenuation of the reference modulation input for compensation purposes is to inject a 10 Hz square wave signal into the transmitter and then to manually tune the VCO loop filter response to provide a 10 Hz square wave response out of the VCO circuit. The 10 Hz square wave input comprises a multiple series of 10 Hz tones, some of the lower frequencies of which will be attenuated more than the higher frequencies and hence will be compensated for by the VCO manual tuning.

A disadvantage associated with this approach is that manual tuning is time consuming and the tune-up process requires specific test equipment, e.g. square wave generator, oscilloscope, system analyzer. In addition, the manual tuning process for obtaining a square wave output is obviously subjective and therefore has some inherent inaccuracy associated with it.

This invention seeks to provide a transmitter circuit, and method of operation, to mitigate some of the problems highlighted above associated with optimizing frequency modulation circuits.

SUMMARY OF THE INVENTION

In a first aspect of the present invention, a transmitter circuit is provided. The transmitter circuit comprises an oscillator circuit having at least one input for receiving at least one modulation signal and an output for providing a modulated signal and a modulation signal circuit operably coupled to the at least one input of the oscillator circuit for providing the at least one modulation The transmitter circuit further comprises a feedback path between the oscillator circuit and the modulation circuit for providing a representation of the modulated signal output from the oscillator circuit to the modulation circuit wherein in response to said modulated signal the modulation circuit automatically adjusts an amplitude level of the at least one modulation signal.

Preferably, the modulation circuit includes a gain control circuit and a processor whereby the processor receives the representation of the modulated signal output from the oscillator circuit and adjusts the amplitude level of the at least one modulation signal in response to the modulation signal.

In this manner, by automatically adjusting say the amplitude level of a low frequency modulation signal, the modulated signal output from the oscillator circuit is automatically corrected to have a flat-amplitude frequency response.

In a second aspect of the present invention, a method of automatically adjusting a modulation signal amplitude level in a transmitter circuit is provided. The transmitter circuit includes an oscillator circuit operably coupled to a modulation circuit. The method comprises the steps of generating a modulation signal by the modulation circuit, applying the modulation signal to the oscillator circuit to provide a modulated signal output from the oscillator circuit and routing a representation of the modulated signal to the modulation circuit via a feedback path. An amplitude level of the modulated signal is then adjusted by the modulation circuit in response to the representation of the modulated signal.

A preferred embodiment of the invention will now be described, by way of example only, with reference to the drawings.

DETAILED DESCRIPTION OF THE DRAWINGS

Figure 1:
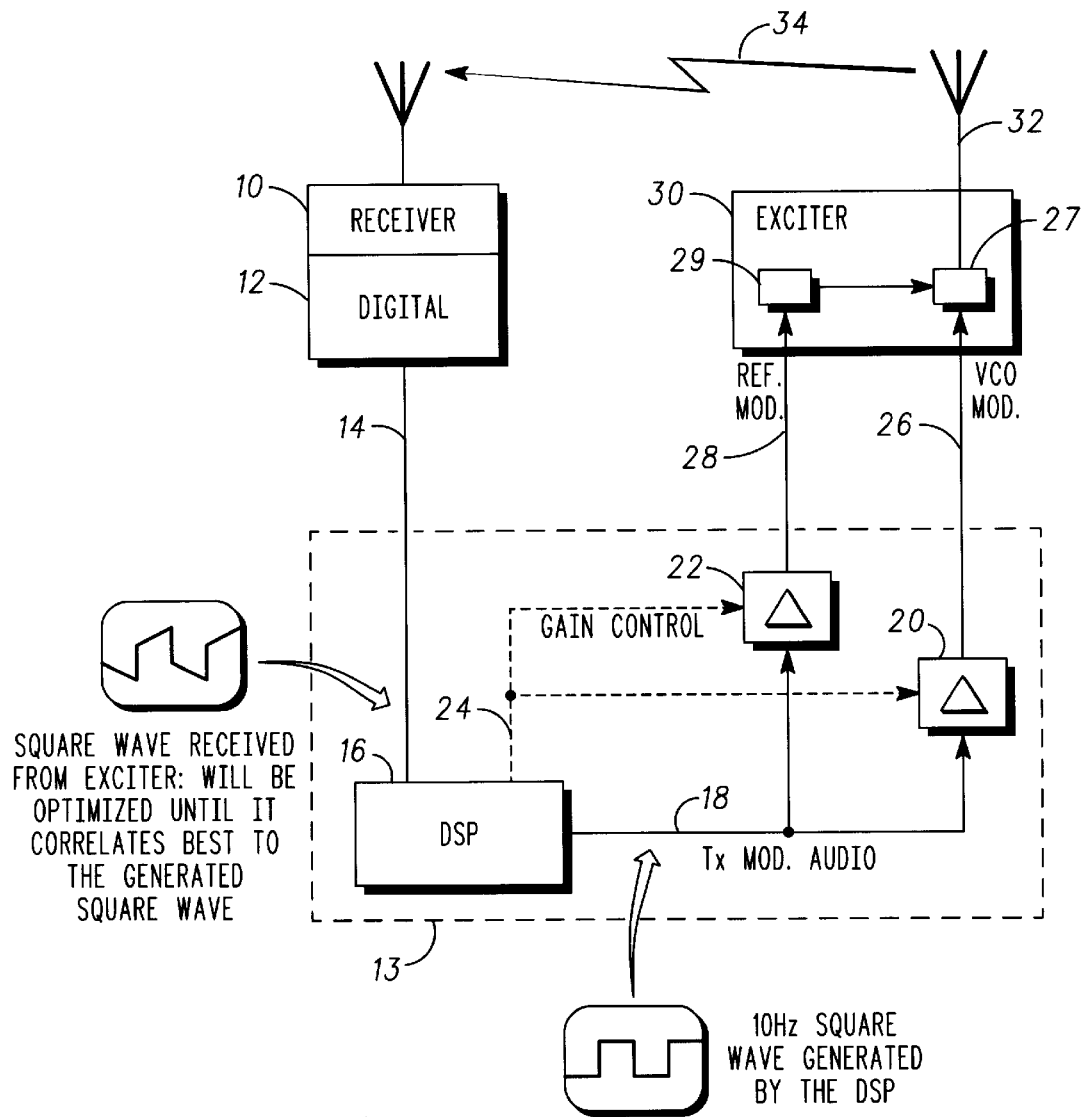
FIG. 1 is a block diagram of a radio unit in accordance with a first aspect of the preferred embodiment of the invention.

Referring first to FIG. 1, a block diagram of a radio unit in accordance with a first aspect of the preferred embodiment of the invention, is shown. The radio unit includes a receiver circuit 10 operably coupled to a digital backend 12 for digitizing received signals. The digital backend 12 is connected to a processor 16 of a modulation circuit 13. The modulation circuit includes a gain control circuit having at least one modulation input and at least one modulation output operably coupled to the at least one input of an oscillator circuit 30. In the preferred embodiment of the invention the gain control circuit includes a reference modulation gain element 20 and to an oscillator control gain element 22. The processor 16 is connected the oscillator circuit 30 via the reference modulation gain element 20 and oscillator control gain element 22.

In a preferred embodiment of the invention, the output 32 from the oscillator circuit 30 is coupled to the receiver circuit 10 via the feedback path 34. It is within the contemplation of the invention that the feedback path 34 is either a hard-wired or over-the air implementation.

In operation, the processor 16 provides a modulation signal to reference modulation gain element 20 and to an oscillator control gain element 22. The gain performance of reference modulation gain element 20 and oscillator control gain element 22 are controlled by the processor 16 via at least one gain control path 24. The reference modulation gain element 20 is used for setting the required deviation of the transmitter carrier signal. The oscillator control gain element 22 is used for setting the correct balance between the reference modulation signal and the VCO modulation signal. The modulation signal is amplified by reference modulation gain element 20 and oscillator control gain element 22 to provide a reference modulation input and a VCO modulation input to the oscillator circuit 30, e.g. an exciter circuit. The exciter circuit includes a synthesizer circuit 29 for receiving the amplified reference modulation signal connected to a VCO circuit for receiving the amplified VCO modulation signal. The amplified reference modulation signal is used for modulation signals below 100 Hz. The frequencies below 100 Hz get attenuated on the VCO path. The modulated signal is then output from the antenna. In the preferred embodiment of the invention, the reference modulation gain element 20 and oscillator control gain element 22 are initially optimized by using a modulation signal which is a low frequency modulation test signal 18. This low frequency modulation test signal 18 is applied to the reference modulation gain element 20 and oscillator control gain element 22 and amplified and input to the oscillator circuit 30. A feedback path 34 routes a representation of the amplified modulated signal output from the oscillator circuit to a receiver circuit where it is demodulated and the performance of the reference modulation gain element 20 and oscillator control gain element 22 assessed.

Preferably, the receiver circuit is the receiver circuit 10, digital backend 12 and processor 16 of the radio unit and the receiver circuit is tuned to operate on the transmit frequency during this operational phase. On assessing the performance of the reference modulation gain element 20 and oscillator control gain element 22, the processor then applies independent amplitude gains to the modulation signal via the at least one gain control path 24 connected to the oscillator control gain element 22 and reference modulation gain element 20, thereby automatically optimizing their individual responses across the whole desired frequency range of operation of the transmitted modulation signal.

In the preferred embodiment of the invention, the low frequency modulation test signal 18 is a low frequency square wave signal generated by the processor 16 for the purpose of automatic aligning the reference modulation gain element 20 and oscillator control gain element 22.

Figure 2:
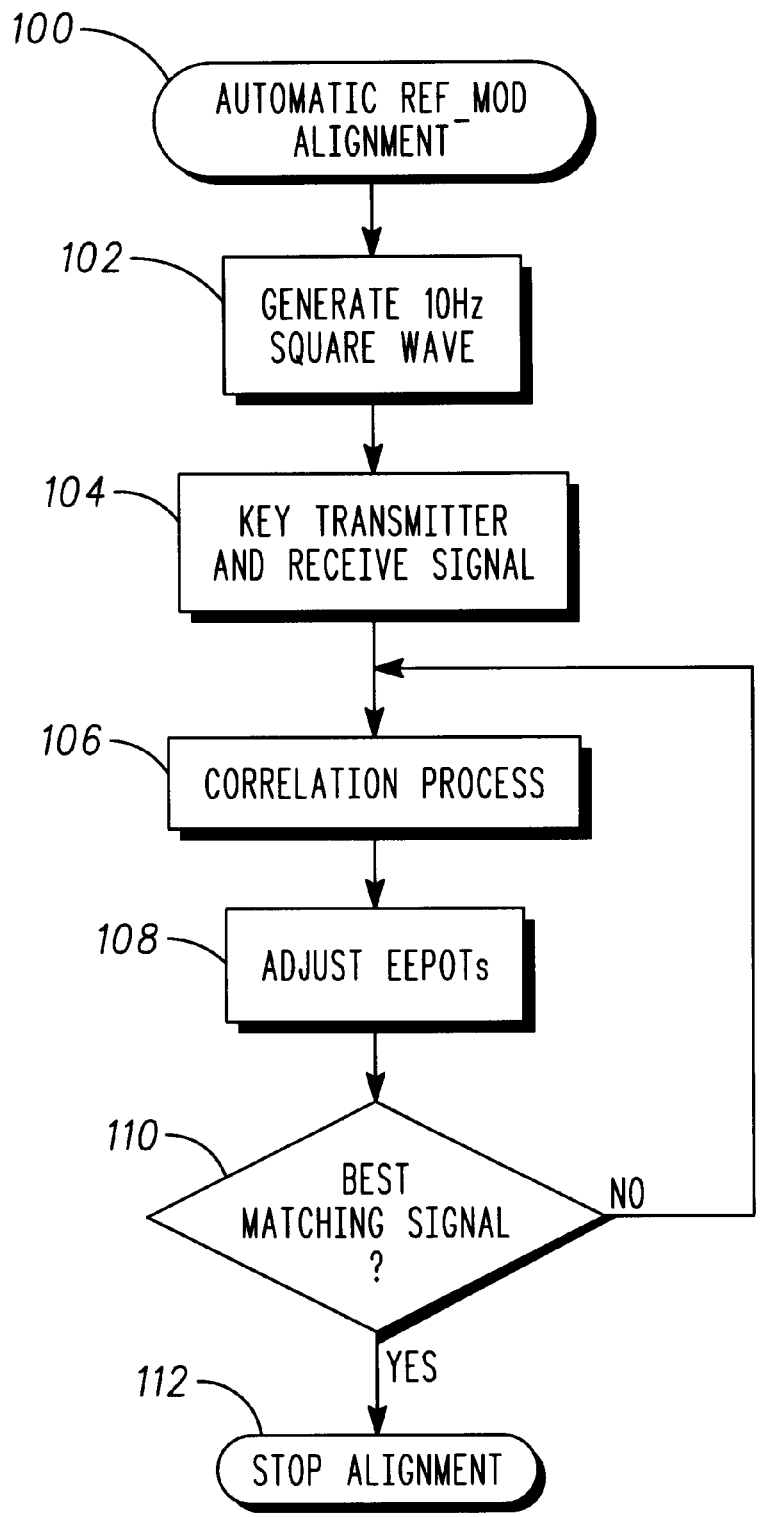
FIG. 2 is a flow chart showing a method for operating a transmitter circuit in accordance with a second aspect of the preferred embodiment of the invention.

An advantageous feature of the transmitter circuit is the automatic optimization of the gain elements associated with the modulation signal. Hence, the process of optimizing the gain performance can be performed on switch-on of the radio unit or whenever appropriate, and not limited to the manual procedure of tuning the radio unit during factory set-up Referring now to FIG. 2, a method for operating the transmitter circuit in accordance with a second aspect of the preferred embodiment of the invention is provided. The method includes the steps of instigating a gain optimization routine, as in step 100, and generating a low frequency modulation test signal 18 by the processor 16 of the modulation circuit 13, as shown in step 102. On keying up the transmitter, the low frequency modulation test signal 18 is applied to the oscillator circuit 30 to provide a modulated signal output from the oscillator circuit 30. A representation of the modulated signal is routed back to the processor where a correlation process is initiated, as shown in step 106. The performance of a gain control circuit of the modulation circuit is assessed and any appropriate adjustments made, as shown in step 108, to optimize their performance across the whole desired frequency range of operation of the oscillator circuit 30, e.g. the frequency modulation/frequency generating circuit of the radio unit. This process is repeated, if required, to achieve the optimum performance of the gain elements, as in step 110. The transmitter's gain control circuit is then optimized for future transmissions, as shown in step 112. Preferably, the gain control circuit includes a reference modulation gain element 20 and an oscillator control gain element 22 and the adjustment includes adjusting the oscillator control gain element 22 independent to the reference modulation gain element 20 to provide a flat frequency response of the modulated signal output from the oscillator circuit 30.

An advantageous feature of the transmitter is the automatic optimization of the gain elements associated with the modulation signal. Hence, the process of optimizing the gain performance can be performed on switch-on of the radio unit or whenever appropriate, and not limited to the manual procedure of tuning the radio unit during factory set-up. In addition, the subjective nature, and subsequent associated problems, of optimizing the modulation circuit has been removed.

Thus a transmitter circuit, and method of operation, is provided that mitigate some of the problems associated with optimizing frequency modulation circuits that were highlighted previously.

We claim:
1. A transmitter circuit comprising:
   an oscillator circuit having at least one input for receiving at least one modulation signal and an output for providing a modulated signal;
   a modulation circuit operably coupled to the at least one input of the oscillator circuit for providing the at least one modulation signal; and
   a feedback path between the oscillator circuit and the modulation circuit for providing a representation of the modulated signal output from the oscillator circuit to the modulation circuit wherein in response to said representation of the modulated signal the modulation circuit automatically adjusts an amplitude level of the at least one modulation signal; and
   wherein the modulation circuit comprises:
      a gain control circuit having at least one modulation input for receiving the at least one modulation signal and at least one first modulation output operably coupled to the at least one input of the oscillator circuit and the gain control circuit adjusts the amplitude level of the at least one modulation signal; and
      a processor operably coupled to the oscillator circuit for receiving the representation of the modulated signal and operably coupled to the gain control circuit for adjusting the amplitude level of the at least one modulation signal provided to the gain control circuit.

2. The transmitter circuit of claim 1, wherein the gain control circuit comprises an oscillator control gain element and a reference modulation gain element for applying independent amplitude gains to the modulation signal.

3. The transmitter circuit of claim 1, wherein the modulation signal generated by the processor comprises a low frequency reference modulation input and an oscillator modulation input for providing automatic processor control of the modulation signal in response to the representation of the modulated signal.

4. The transmitter circuit of claim 1, wherein the processor is further operably coupled to the gain control circuit via at least one gain control path for adjusting the modulation signal.

5. The transmitter circuit of claim 1, wherein the transmitter circuit is part of a radio unit and the feedback path incorporates a receiver circuit of the radio unit, the receiver circuit being operably coupled to the modulation circuit of the transmitter circuit for providing the representation of the modulated signal output from the oscillator circuit of the transmitter circuit to the modulation circuit via the receiver circuit.

6. The transmitter circuit of claim 1 wherein the modulated signal is a frequency modulated signal.

7. A method of automatically adjusting a modulation signal amplitude level in a transmitter circuit having an oscillator circuit operably coupled a modulation circuit including a processor operably coupled to a gain control circuit, the method comprising the steps of:

generating a modulation signal by the processor;

applying the modulation signal to the gain control circuit of the oscillator circuit to provide a modulated signal;

routing a representation of the modulated signal output from the oscillator circuit to the modulation circuit via a feedback path; and adjusting an amplitude level of the modulated signal by the modulation circuit in response to the representation of the modulated signal by adjusting at least one gain performance of the gain control circuit by the processor to automatically adjust an amplitude level of the at least one modulation signal in response to the representation of the modulated signal.

8. The method of automatically adjusting a modulation signal amplitude level of a transmitter circuit according to claim 7, wherein the at least one gain circuit includes a reference modulation gain element and an oscillator gain element, the modulation signal being a low-frequency square wave reference signal and the step of adjusting includes adjusting the reference modulation gain element independent to the oscillator gain element to provide a flat frequency response of the modulated signal output from the oscillator circuit.

9. The method of automatically adjusting a modulation signal amplitude level of a transmitter circuit according to claim 8, wherein the modulation circuit operates in a radio unit and the low-frequency square wave reference signal is generated by the processor when the radio unit is switched on.

10. The method of automatically adjusting a modulation signal amplitude level of a transmitter circuit according to claim 7, the method further comprising the step of optimising the amplitude level of the modulated signal output by successively feeding back subsequent representations of the modulated signal from the oscillator circuit to the processor.

* * * * *